(12) United States Patent
Neumeyer et al.

(10) Patent No.: US 8,345,483 B2
(45) Date of Patent: Jan. 1, 2013

(54) SYSTEM AND METHOD FOR ADDRESSING THRESHOLD VOLTAGE SHIFTS OF MEMORY CELLS IN AN ELECTRONIC PRODUCT

(75) Inventors: Frederick C. Neumeyer, Austin, TX (US); Greg Yancey, Austin, TX (US); Pedro Sanchez, Austin, TX (US); Iftekhar Rahman, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 160 days.

(21) Appl. No.: 13/011,706

(22) Filed: Jan. 21, 2011

(65) Prior Publication Data

US 2012/0188820 A1    Jul. 26, 2012

(51) Int. Cl.
*G11C 11/34* (2006.01)

(52) U.S. Cl. ........... 365/185.18; 365/185.2; 365/185.21; 365/185.24; 365/185.33

(58) Field of Classification Search ............. 365/185.18, 365/185.2, 185.21, 185.24, 185.33
See application file for complete search history.

(56) References Cited

U.S. PATENT DOCUMENTS

| | | | | |
|---|---|---|---|---|
| 5,142,495 A | * | 8/1992 | Canepa | 365/185.2 |
| 5,966,330 A | * | 10/1999 | Tang et al. | 365/185.2 |
| 6,118,701 A | * | 9/2000 | Uekubo | 365/185.2 |
| 6,370,060 B2 | * | 4/2002 | Takata et al. | 365/185.21 |
| 6,650,570 B2 | * | 11/2003 | Tanzawa et al. | 365/185.2 |
| 6,826,103 B2 | * | 11/2004 | Moon et al. | 365/185.21 |
| 7,020,037 B2 | * | 3/2006 | Anzai et al. | 365/185.2 |
| 7,123,514 B2 | * | 10/2006 | Watanabe | 365/185.21 |
| 7,457,178 B2 | * | 11/2008 | Tu et al. | 365/185.24 |
| 7,495,955 B2 | * | 2/2009 | Ido | 365/185.2 |
| 7,596,037 B2 | * | 9/2009 | Sarin et al. | 365/185.2 |
| 7,599,220 B2 | * | 10/2009 | Lin et al. | 365/185.2 |
| 7,729,165 B2 | * | 6/2010 | Wang | 365/185.24 |
| 7,821,836 B2 | * | 10/2010 | Kim et al. | 365/185.18 |
| 7,864,588 B2 | * | 1/2011 | Betser et al. | 365/185.2 |
| 8,094,493 B2 | * | 1/2012 | Hsieh et al. | 365/185.18 |

* cited by examiner

*Primary Examiner* — Trong Phan

(57) ABSTRACT

Methods and systems for addressing threshold voltage shifts of memory cells. A method includes reading a pattern of data from a first plurality of memory cells, comparing the read of the pattern of data with a known pattern of data using a reference, and if the read of the pattern of data and the known pattern of data do not match, adjusting the reference to find a reference level that results in a matching of a read of the pattern of data and the known pattern of data. Thereafter, trim sector data is read into a second plurality of memory cells using the adjusted reference level.

20 Claims, 7 Drawing Sheets

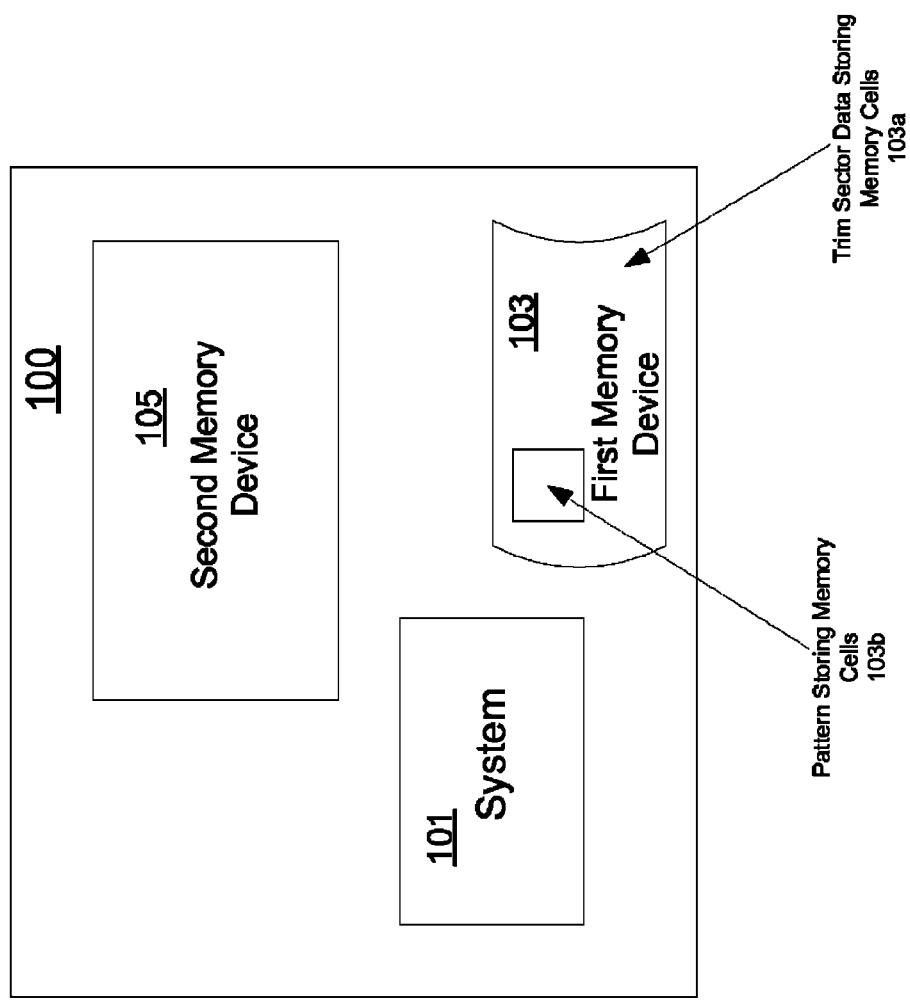

SYSTEM AND METHOD FOR ADDRESSING THRESHOLD VOLTAGE SHIFTS OF MEMORY CELLS IN AN ELECTRONIC PRODUCT

BACKGROUND

A DIMM, or dual in-line memory module, comprises a series of dynamic random access memory integrated circuits. These modules are mounted on a printed circuit board and are designed for use in personal computers, workstations and servers. Some memory technologies use DIMMs in conjunction with flash memory chips. DIMMs can be formed to contain hundreds of flash memory chips. The manufacturing process that is used to produce these products can involve operations that include heating and attaching the flash memory chips to the DIMMs.

During the manufacturing process, for various reasons, the threshold voltages of individual memory cells of a memory device can shift relative to a static reference. When this occurs, the memory cells whose threshold voltages have shifted can be rendered unreadable. This can be especially problematic at power-up before the chip has loaded "tuning" information.

Approaches used to address the problem of threshold voltage shifts include using dynamic reference cells to track shifts in the threshold voltage of core memory cells and erasing and reprogramming parts. Dynamic reference cells attempt to track shifts in core memory cell threshold voltage such that data stored in the core memory cells can be read correctly. However, a significant shortcoming of this approach is that the dynamic reference cells themselves are susceptible to threshold voltage shifts and are not particularly effective with regard to threshold voltage shifts of core memory cells that are not small. In practice the voltage shifts exhibited by the dynamic reference cells themselves can be so large that the dynamic reference cells simply can not keep track of the threshold voltage shifts of the core memory cells.

Erasing and reprogramming parts attempts to address the problem of threshold voltage shifts of memory cells by erasing and reprogramming the memory cells in order to cause the memory cells to read correctly. However, erasing and reprogramming parts is practical for only a small number of applications and can involve loading software from an external device which exacts a significant time cost. Consequently, conventional approaches have proven to be unsatisfactory as it relates to addressing threshold voltage shifts of memory cells in electronic products.

SUMMARY OF THE INVENTION

Systems and methods for addressing threshold voltage shifts of memory cells in an electronic product. A method includes reading a pattern of data from a first plurality of memory cells, comparing the read of the pattern of data with a known pattern of data using a reference, and if the read of the pattern of data and the known pattern of data do not match, adjusting the reference to find a reference level that results in a matching of a read of the pattern of data from the first plurality of memory cells and the known pattern of data. Thereafter, trim sector data is read into a second plurality of memory cells using the adjusted reference level.

BRIEF DESCRIPTION OF THE DRAWINGS

The invention, together with further advantages thereof, may best be understood by reference to the following description taken in conjunction with the accompanying drawings in which:

FIG. 1A shows an exemplary operating environment of a system for addressing threshold voltage shifts of memory cells in an electronic product according to one embodiment.

It should be noted that like reference numbers refer to like elements in the figures.

DETAILED DESCRIPTION OF THE INVENTION

Figure 1B:
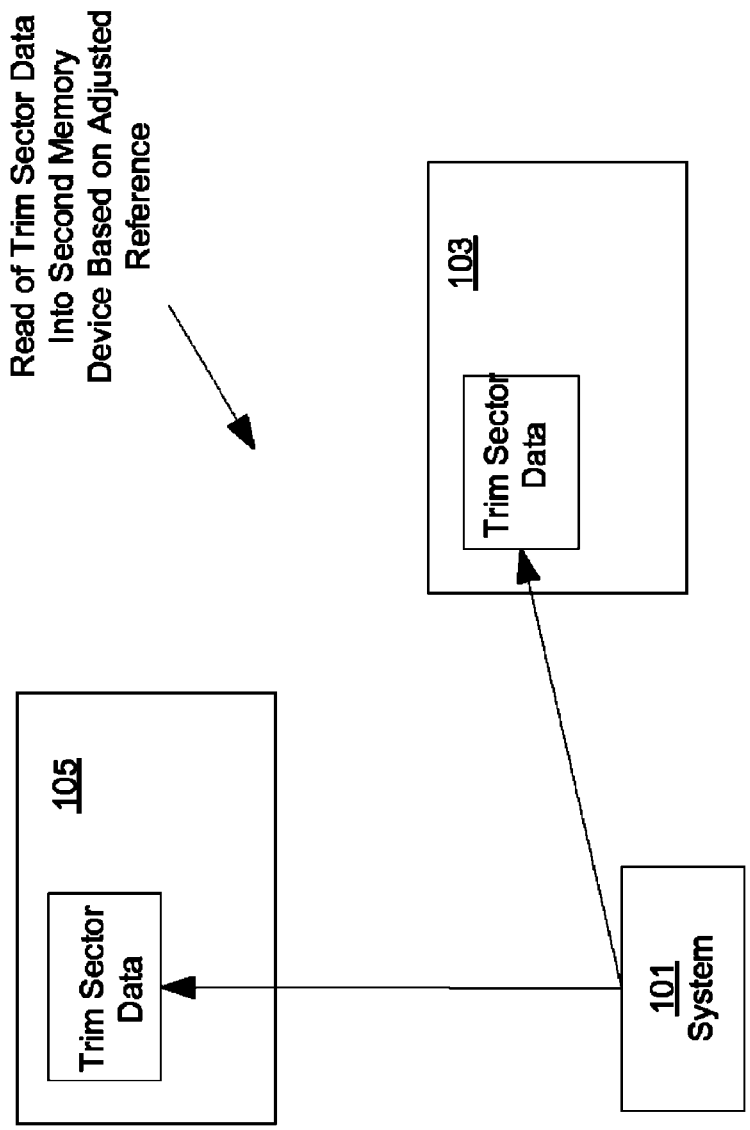
FIG. 1B illustrates the reading of trim sector data stored in a first memory device into a second memory device based on an adjusted reference according to one embodiment.

The present invention will now be described in detail with reference to various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Exemplary Operating Environment of a System for Addressing Threshold Voltage Shifts of Memory Cells in an Electronic Product According to One Embodiment FIG. 1A shows an exemplary operating environment of a system 101 for addressing threshold voltage shifts of memory cells in an electronic product according to one embodiment. The exemplary operating environment for system 101 includes an electronic product 100 that contains system 101. System 101 provides an on chip response to shifts in the threshold voltage of memory cells including memory cells that store trim sector data. More specifically, in response to a detected shift in the threshold voltage of designated memory cells, system 101 identifies a reference level for a reference (e.g., a current or voltage reference) that is used to read trim sector data that enables the trim sector data to be read correctly despite the shift in threshold voltage. In the FIG. 1A embodiment electronic product 100 includes system 101, first memory device 103 that includes trim sector data storing memory cells 103a and pattern storing memory cells 103b, and second memory device 105.

Referring to FIG. 1A, electronic product 100 can be any electronic product with memory especially electronic products that include memory with small margins that experience threshold voltage shifts. In one embodiment, electronic product 100 can include a DIMM (dual in line memory module). In other embodiments, electronic product 100 can include other type devices.

First memory device 103 includes trim sector data storing memory cells 103a and pattern storing memory cells 103b. In one embodiment, first memory device 103 can include a flash memory device. In other embodiments, first memory device 103 can include other types of memory devices. Second memory device 105 is a separate memory device of electronic product 100 into which trim data can be read to facilitate operation of electronic product 100. In one embodiment, second memory device 105 may be an SRAM. In other embodiments, second memory device can include other types of memory devices.

Trim sector data storing memory cells 103a stores the trim sector data (e.g., start up data, configuration data, reference values, etc.) that is used to operate electronic product 100. In one embodiment, the trim sector data may be read into second memory device 105 for use in the operation of electronic product 100 using a reference that may be adjusted if an indication is received that the threshold voltages of memory cells of at least pattern storing memory cells 103b have shifted.

Pattern storing memory cells 103b are a group of memory cells that are programmed to contain a known pattern of voltages. In one embodiment, pattern storing memory cells 103b are read to determine if the known pattern of voltages reads as is expected when a predetermined reference is used. In one embodiment, if the known pattern of voltages does not read as is expected, the incorrect read is taken as an indication that the threshold voltages of memory cells 103a and 103b may have shifted. In one embodiment, pattern storing memory cells 103b may be initially read upon start up of electronic product 100. In other embodiments, pattern storing memory cells may be read in conjunction with non power up reads.

System 101 determines whether there has been a shift in the threshold voltage of pattern storing memory cells 103b and if a shift is detected adjusts the reference used to read pattern storing memory cells 103b and trim sector storing memory cells 103a. The adjusted reference enables the pattern storing memory cells 103b and the trim storing memory cells 103a to be read correctly despite the threshold voltage shifts. In one embodiment, after the reference is adjusted, system 101 can read the trim sector data (e.g., microcode and trim values) that is stored in trim sector storing memory cells 103a into second memory device 105 based on the adjusted reference.

Operation

In operation, when device 100 is powered up, system 101 executes a read of the known pattern that is stored in pattern storing memory cells 103b of first memory device 103 to determine if the threshold voltage of these memory cells have shifted. In one embodiment, by comparing a read of the known pattern that is stored in pattern storing memory cells 103b to expected read values corresponding to the known pattern using a predetermined reference (see discussion below made with reference to FIG. 2B and FIG. 2C), it can be determined if the threshold voltage of pattern storing memory cells 103b have shifted. If it is determined that the threshold voltage of pattern storing memory cells 103b have shifted, then the reference is adjusted until the known pattern stored in pattern storing memory cells 103b reads correctly (e.g., known pattern read). In one embodiment, thereafter, as shown in FIG. 1B, system 101 can read the remainder of the trim sector data stored in first memory device 103, including microcode and trim values, into second memory device 105 based on the adjusted reference. In an alternate embodiment, system 101 can be used in conjunction with non power up reads to improve margin and reliability (a known pattern or any given wordline). In one embodiment, if system 101 is used in conjunction with non power up reads, system 101 can be implemented in RTL (register transfer level).

Figure 2A:
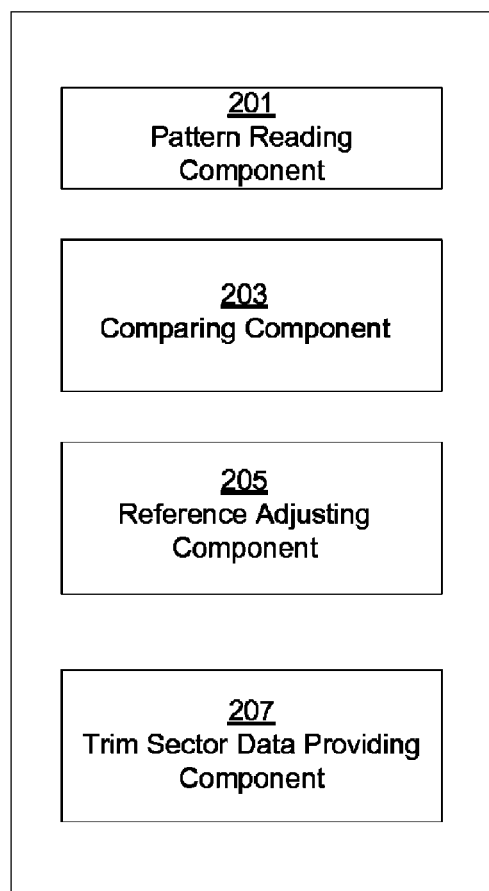
FIG. 2A shows components of system for addressing threshold voltage shifts of memory cells of an electronic product according to one embodiment.

Components of System for Addressing Threshold Voltage Shifts of Memory Cells of an Electronic Product According to One Embodiment FIG. 2A shows components of system 101 for addressing threshold voltage shifts of memory cells of an electronic product according to one embodiment. In one embodiment, the components can be implemented in hardware, firmware or software or a combination thereof. In the FIG. 2A embodiment, system 101 includes pattern reading component 201, comparing component 203, reference adjusting component 205, and trim sector providing component 207.

Referring to FIG. 2A, pattern reading component 201 executes a read of a known pattern that is located in designated pattern storing memory cells (103b in FIG. 1A). In one embodiment, the known pattern is a known worst case pattern. In one embodiment, the known pattern is used to program the designated pattern storing memory cells to have a tight margin (e.g., the difference between the sense memory cell current that determines a charge level and the reference current used to identify the charge level in the memory cell is small).

Comparing component 203 compares the read of the known pattern stored in the designated pattern storing memory cells with the expected read values that correspond to the known pattern using a predetermined reference level (e.g., current or voltage magnitude). If the pattern reads correctly, the remainder of the trim sector is read into memory (e.g., SRAM). If the pattern does not read correctly the reference is adjusted and the pattern stored in the pattern storing memory cells is reread using the adjusted reference.

Reference adjusting component 205 adjusts the reference (adjusts the amplitude of the current or voltage reference) when a comparison of the known pattern stored in the pattern storing memory cells with the expected read values that correspond to the known pattern indicates that the threshold voltage of the memory cells have shifted. In one embodiment, the reference adjusting component finds a setting of the reference current (or voltage) that enables the known pattern that is stored in the pattern storing memory cells to read correctly. In one embodiment, an algorithm can be used to find a setting of the reference that enables the known pattern that is stored in the pattern storing memory cells to read correctly. In one embodiment, a binary search of a range of reference current values can be executed to determine a reference current level that enables the known pattern that is stored in the pattern storing memory cells to read correctly. In one embodiment, the complete range of possible reference current levels can be tested and the reference current level that has the middle passing value or the most passing values on either side can be used. In one embodiment, the algorithm can test the entire range of possible reference current levels and use the reference current level that provides the best margin, or alternately, the first passing reference current level in order to save time.

Trim sector reading component 207 reads the trim sector data into memory (e.g., SRAM) based on the adjusted reference (see FIG. 1B). In one embodiment, the trim sector data can include microcode and trim values. In one embodiment, using the adjusted reference current level as the trim reference causes the part to operate properly despite a number of possible issues (temperature, voltage, Vt shifts, etc.).

Exemplary Embodiments

Figure 2B:
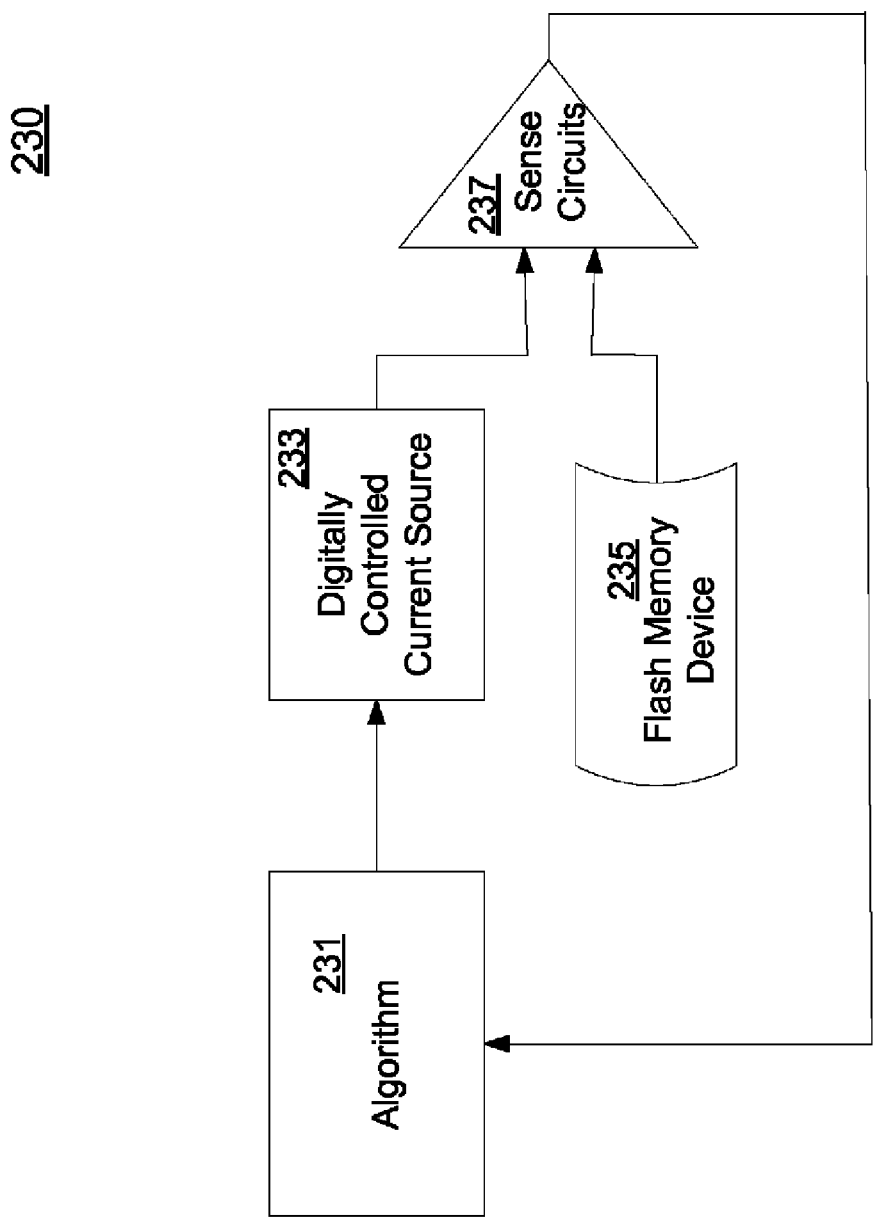
FIG. 2B shows an exemplary implementation of a system for addressing threshold voltage shifts of memory cells in an electronic product according to one embodiment.

FIG. 2B shows an exemplary embodiment 230 of system for addressing threshold voltage shifts of memory cells in an electronic product. FIG. 2B shows algorithm 231, digitally controlled current source 233, flash memory device 235 and sense circuits 237. In operation, sense circuits 237 receive inputs from flash memory device 235 and digitally controlled current source 233. If a read of a known pattern stored in flash memory device 235 does not match the expected read values that correspond to the known pattern based on the reference received from digitally controlled current source 233, sense circuits 237 provide an output responsive to this condition that is input to algorithm 231. Responsive to the indication that the read of the known pattern from flash memory device 235 and the expected read values of the known pattern do not match, algorithm 231 generates an output that is provided as input to digitally controlled current source 233. In response, the current that is provided by the digitally controlled current source is adjusted based on the input that is provided by the algorithm until a current level is found that enables the known pattern that is stored in the pattern storing memory cells (103b in FIG. 1A) to be read correctly.

Figure 2C:
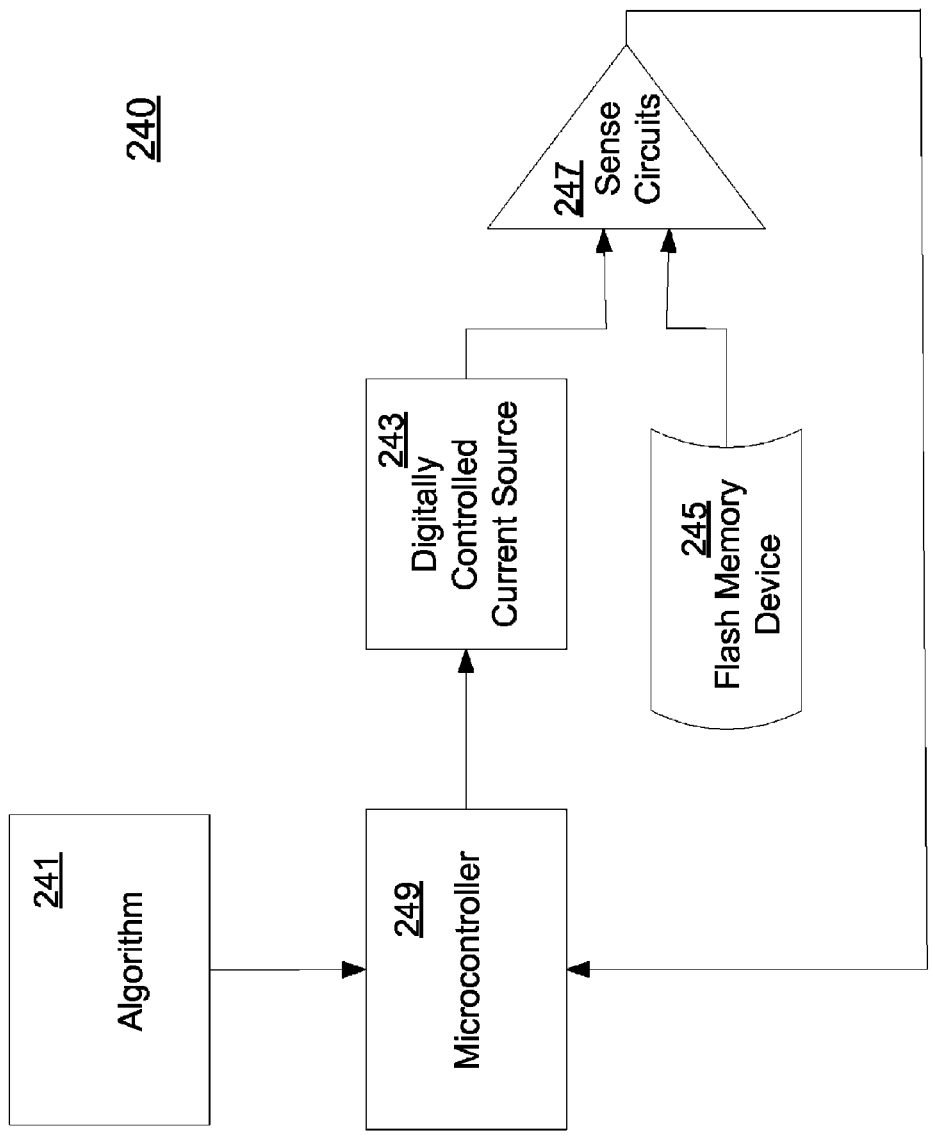
FIG. 2C shows an exemplary implementation of system for addressing threshold voltage shifts of memory cells in an electronic product according to one embodiment.

FIG. 2C shows an exemplary embodiment 240 of system for addressing threshold voltage shifts of memory cells in an electronic product. FIG. 2C shows algorithm 241, digitally controlled current source 243, flash memory device 245, sense circuits 247 and microcontroller 249. In operation, sense circuits 247 receive inputs from flash memory device 245 and digitally controlled current source 243. If a read of the known pattern stored in flash memory device 245 does not match the expected read values that correspond to the known pattern based on the reference received from digitally controlled current source 243, sense circuits 247 provide an output responsive to this condition that is input to microcontroller 249. Responsive to the indication that the read of the known pattern from memory device 245 and the expected read values of the known pattern do not match, microcontroller 249 generates an output that is provided as input to digitally controlled current source 243. The current provided by digitally controlled current source 243 is adjusted based on the input that is provided by microcontroller 249 until a current level is found that enables the pattern that is stored in the memory cells to be read correctly. In the FIG. 2C embodiment, microcontroller 249 is controlled via inputs from algorithm 241.

Figure 3:
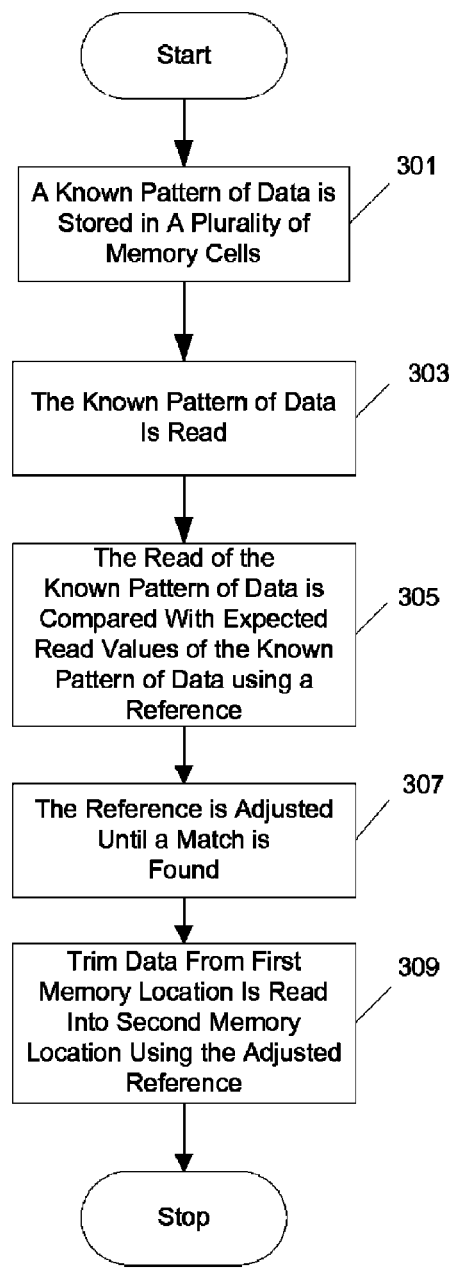
FIG. 3 shows operations performed as a part of a method for addressing threshold voltage shifts of memory cells of an electronic product according to one embodiment.

Flowchart of Method of Addressing Threshold Voltage Shifts of Memory Cells of an Electronic Product According to One Embodiment FIG. 3 is a flowchart of the operations 300 performed as a part of a method for addressing threshold voltage shifts of memory cells of an electronic product according to one embodiment. The flowchart includes processes that, in one embodiment can be carried out by electrical components under the control of computer-readable and computer-executable instructions. Although specific steps are disclosed in the flowcharts, such steps are exemplary. That is the present invention is well suited to performing various other steps or variations of the steps recited in the flowcharts. Within various embodiments, it should be appreciated that the steps of the flowcharts can be performed by hardware, by firmware, by software or by a combination of these mediums.

Referring to FIG. 3, at 301, a known pattern of data is stored in a plurality of memory cells of a first memory device. In one embodiment the known pattern of data can be a worst case pattern of data. In one embodiment, the plurality of memory cells is located in a first memory device.

At 303, a read of the known pattern of data stored in the plurality of memory cells at 301 is executed. In one embodiment, the execution of the read of the known pattern of data that is stored in the plurality of memory cells is a first read of the data.

At 305, the read of the known pattern of data stored in the plurality of memory cells is compared with expected read values for the known pattern of data using a reference.

At 307, if the read of the known pattern of data stored in the plurality of memory cells and the expected read values for the known pattern of data do not match, the reference is adjusted until a reference level is found that results in a match.

At 309, trim sector data stored in first memory locations is read into second memory locations using the adjusted reference. In one embodiment, the first and second memory locations are a part of first and second memory devices respectively. In one embodiment, the second memory device can be an SRAM.

Figure 4:
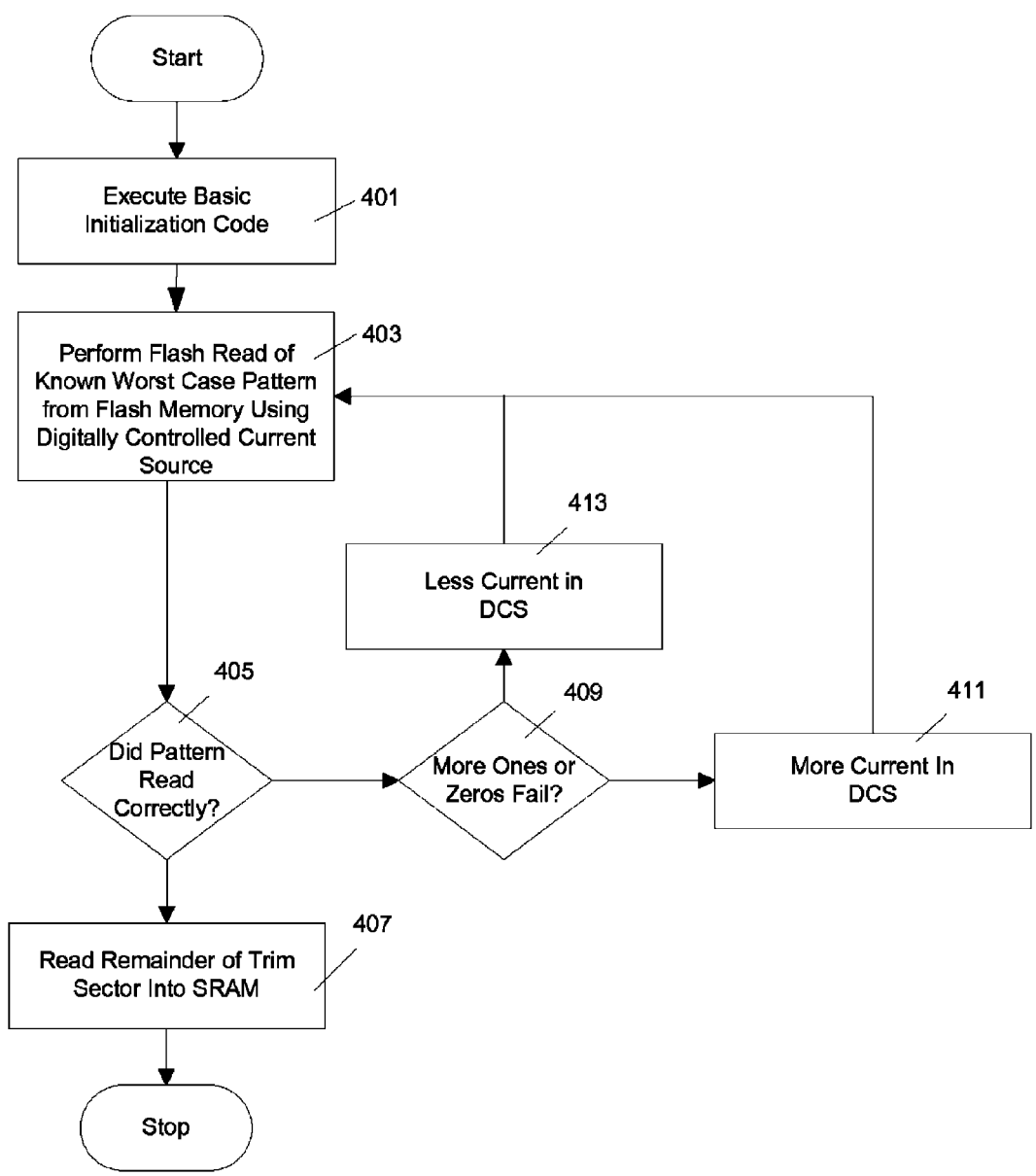
FIG. 4 shows an exemplary algorithm for addressing threshold voltage shifts of memory cells of an electronic product according to one embodiment.

FIG. 4 shows an exemplary embodiment of an algorithm 400 for addressing threshold voltage shifts of memory cells of an electronic product according to one embodiment.

At 401, basic initialization code is executed.

At 403, a flash read of a known worst case pattern stored in flash memory is performed using a digitally controlled current source.

At 405, it is determined whether the known pattern reads correctly. If the known pattern reads correctly, then the process proceeds to 407, and the remainder of the trim data stored in flash memory is read into SRAM. If the known pattern is not read correctly, then the process proceeds to 409, and it is determined whether more ones or zeros failed in the comparison performed at 405. If it is determined that more ones failed, then the digitally controlled current source is adjusted to provide less current at 413. If it is determined that more zeros failed, then the digitally controlled current source is adjusted to provide more current at 411.

In one embodiment, the algorithm that is used can involve a plurality of operations. For example, in one embodiment, the algorithm can direct a binary search using a digitally controlled current source: starting with a read at 10 ua and finding that 0 s fail at 10 ua, direct a move to (30 ua−10 ua)/2+10 ua=20 ua, and direct that a read then be executed using 20 ua, and finding that 1 s fail at 20 ua, direct a move to (20 ua−10 ua)/2−20 ua=15 ua, and direct that a read next be executed using 15 ua, etc. until a passing reference level is found.

In one embodiment, the algorithm can direct a sweep of the complete range of possible reference levels (e.g., current values), and finding a passing value, guard band either side. For example, in one embodiment, the algorithm can direct a sweep of 0-30 uA, where passes are found at 9 ua, 9.5 ua, 10 ua, 10.5 ua and 11 ua. In this example, 10 ua may be chosen as it is the middle value with the most passes on either side. Alternately, an algorithm can direct a sweep of the entire range of possible reference levels and use the reference level that provides the best sense margin or can terminate the search when the reference level that provides the first passing read is found such that time is saved.

With reference to exemplary embodiments thereof, methods and systems for addressing threshold voltage shifts of memory cells relative to a reference level are disclosed. A method includes reading a pattern of data from a first plurality of memory cells, comparing the read of the pattern of data with a known pattern of data, using a reference, and if the read of the pattern of data and the known pattern of data do not match, adjusting the reference to find a reference level that results in a matching of a read of the pattern of data from the first plurality of memory cells and the known pattern of data.

Thereafter, trim sector data is read into a second plurality of memory cells using the adjusted reference level.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

We claim:

1. A method for addressing threshold voltage shifts of memory cells, comprising:
   reading a pattern of data from a first plurality of memory cells, wherein said reading is a first read of said data;
   using a reference, comparing said read of said pattern of data from said first plurality of memory cells with a known pattern of data;
   if said read of said pattern of data from said first plurality of memory cells and said known pattern of data do not match, adjusting said reference to find an adjusted reference level that results in a matching of a read of said pattern of data and said known pattern of data; and
   reading trim sector data into a second plurality of memory cells using said adjusted reference level.

2. The method of claim 1 wherein said adjusting said reference to find an adjusted reference level is controlled by an algorithm.

3. The method of claim 1 wherein said reference comprises a digital current source provided reference.

4. The method of claim 3 wherein said digital current source is controlled by a microcontroller.

5. The method of claim 1 wherein said reading a pattern of data from said first plurality of memory cells comprises reading from a flash memory device.

6. The method of claim 1 wherein said second plurality of memory cells comprises memory cells of an SRAM.

7. The method of claim 1 wherein said reading said trim sector data into a second plurality of memory cells comprises reading said trim sector data from a flash memory device into an SRAM.

8. A system for addressing threshold voltage shifts of memory cells, comprising:
   a reading component for executing a read of a pattern of data stored in a first plurality of memory cells, wherein said read is a first read of said data;
   a comparing component for comparing said read of said pattern of data stored in said first plurality of memory cells with a known pattern of data using a reference;
   an adjusting component for adjusting said reference until a read of said pattern of data stored in said first plurality of memory cells and said known pattern of data matches; and
   a trim providing component for reading trim data into a second plurality of memory cells using said adjusted reference.

9. The system of claim 8, wherein said comparing component receives an input from a current source and a memory device.

10. The system of claim 8, wherein said adjusting component comprises an algorithm.

11. The system of claim 8, wherein said adjusting component comprises an algorithm and a microcontroller.

12. The system of claim 8, wherein said reading component executes a read of said pattern of data from a flash memory device.

13. The system of claim 8, wherein said pattern of data comprises microcode that is stored in said first plurality of memory cells.

14. The system of claim 8, wherein said read of said pattern of data is one of a start up read or a non start up read.

15. A device, comprising:
   memory cells; and
   a system for addressing threshold voltage shifts of memory cells, comprising:
   a reading component for executing a read of a known pattern of data stored in a plurality of memory cells of said device, wherein said read is a first read of said data;
   comparing component for comparing said read of said known pattern of data stored in said plurality of memory cells with expected read values corresponding to said known pattern of data using said reference;
   an adjusting component for adjusting said reference until a read of said pattern of data stored in said plurality of memory cells and said expected read values corresponding to said known pattern of data matches; and
   a trim providing component for reading trim data into a second plurality of memory cells using said adjusted reference.

16. The device of claim 15, wherein said comparing component receives an input from a current source and a memory device.

17. The device of claim 15, wherein said adjusting component comprises an algorithm.

18. The device of claim 15, wherein said adjusting component comprises an algorithm and a microcontroller.

19. The device of claim 15, wherein said reading component executes a read of said pattern of data from a flash memory device.

20. The device of claim 15, wherein said pattern of data comprises microcode that is stored in said plurality of memory cells.

* * * * *